US012772625B2

(12) United States Patent
Lüchinger

(10) Patent No.: US 12,772,625 B2
(45) Date of Patent: Oct. 20, 2026

(54) LIGHT EMITTING COMPONENT, A LIGHT EMITTING DEVICE AND A SHEET-LIKE MATERIAL

(71) Applicant: Avantama AG, Stäfa (CH)

(72) Inventor: Norman Albert Lüchinger, Stäfa (CH)

(73) Assignee: Avantama AG, Stäfa (CH)

( * ) Notice: Subject to any disclaimer, the term of this patent is extended or adjusted under 35 U.S.C. 154(b) by 1003 days.

(21) Appl. No.: 17/999,600

(22) PCT Filed: May 21, 2021

(86) PCT No.: PCT/EP2021/063671

§ 371 (c)(1),
(2) Date: Nov. 22, 2022

(87) PCT Pub. No.: WO2021/234154

PCT Pub. Date: Nov. 25, 2021

(65) Prior Publication Data

US 2023/0223501 A1 Jul. 13, 2023

(30) Foreign Application Priority Data

May 22, 2020 (EP) .................................... 20176095
May 29, 2020 (EP) .................................... 20177385
Jul. 7, 2020 (EP) .................................... 20184584

(51) Int. Cl.
*H10H 20/851* (2025.01)
*C09K 11/02* (2006.01)
(Continued)

(52) U.S. Cl.
CPC ....... *H10H 20/8513* (2025.01); *C09K 11/025* (2013.01); *C09K 11/665* (2013.01); *G02F 1/133614* (2021.01); *H10H 20/811* (2025.01)

(58) Field of Classification Search
CPC .................. C09K 11/665; C09K 11/02; H10H 20/8513; H10H 20/854; H10H 20/811
See application file for complete search history.

(56) References Cited

U.S. PATENT DOCUMENTS 10,775,671 B2 9/2020 Lüchinger et al.
11,098,247 B2 8/2021 Lüchinger et al.
(Continued)

FOREIGN PATENT DOCUMENTS

EP 3296378 A1 3/2018
JP 2015052648 A 3/2015
(Continued)

OTHER PUBLICATIONS

Arkema. SR506C: Technical Data Sheet. Retrieved from https://americas.sartomer.arkema.com/assets/arkema/TDS_SR506%20C_MDM-11601-00-AM_en_WW.pdf on Mar. 11, 2026 (Year: 2026).*
(Continued)

*Primary Examiner* — Matthew E. Hoban
(74) *Attorney, Agent, or Firm* — Renner, Otto, Boiselle & Sklar, LLP

(57) ABSTRACT

A light emitting component comprising a light source (10) for emitting blue light (aa), a first layer (1) comprising a red phosphor, and a second layer (2) comprising luminescent crystals (20). Upon absorption of the light emitted by the light source (10), the luminescent crystals (20) emit light of a wavelength in the green light spectrum (cc). The first layer (1) is arranged adjacent to the light source (10). The second layer (2) is arranged remotely from the first layer (1).

9 Claims, 7 Drawing Sheets

(51) Int. Cl.

| | |
|---|---|
| ***C09K 11/66*** | (2006.01) |
| ***G02F 1/1335*** | (2006.01) |
| ***H10H 20/811*** | (2025.01) |

(56) References Cited

U.S. PATENT DOCUMENTS

| | | | | |
|---|---|---|---|---|
| 12,448,565 | B2 * | 10/2025 | Lüchinger | C08F 122/10 |
| 2017/0186922 | A1 | 6/2017 | Kim et al. | |
| 2021/0380820 | A1 | 12/2021 | Harada et al. | |

FOREIGN PATENT DOCUMENTS

| | | | |
|---|---|---|---|
| JP | 2019502954 | A | 1/2019 |
| JP | 2019526658 | A | 9/2019 |
| JP | 2020070444 | A | 5/2020 |
| WO | 2011053635 | A1 | 5/2011 |
| WO | 2017108568 | A1 | 6/2017 |
| WO | 2017195062 | A1 | 11/2017 |
| WO | WO2018028870 | * | 2/2018 |
| WO | 2018146561 | A1 | 8/2018 |
| WO | 2020130592 | A1 | 6/2020 |

OTHER PUBLICATIONS

Arkema. SR595: Technical Data Sheet. Retrieved from https://americas.sartomer.arkema.com/assets/arkema/TDS_SR595_MDM-11136-00-AM_en_WW.pdf on Mar. 11, 2026 (Year: 2026).*

International Search Report and Written Opinion Corresponding with Application No. PCT/EP2021/063671 mailed Jul. 9, 2021.

Heleen F. Sijbom et al: "Paper No S6.4: K 2 SiF 6 : Mn 4+ as a Red Phosphor for Remote Phosphor LEDs", SI D International Symposium. Digest of Technical Papers, vol. 46, No. S1, Sep. 1, 2015.

* cited by examiner

LIGHT EMITTING COMPONENT, A LIGHT EMITTING DEVICE AND A SHEET-LIKE MATERIAL

This application is a national phase of International Application No. PCT/EP2021/063671 filed May 21, 2021, which claims priority to European Patent Application No. 20184584.9 filed Jul. 7, 2020, European Patent Application No. 20177385.0 filed May 29, 2020, and European Patent Application No. 20176095.6 filed May 22, 2020, each of which is hereby incorporated herein by reference in its entirety.

TECHNICAL FIELD

The invention relates in a first aspect to a light emitting component and in a second aspect to a light emitting device comprising the light emitting component as well as in a third aspect to a sheetlike material.

BACKGROUND ART

State-of-the-art liquid crystal displays (LCD) or display components comprise quantum dot based components. In particular, a backlight component of such a LCD might comprise a RGB backlight consisting of a red, a blue and a green light. Today, typically quantum dot particles are used to produce the backlight colours of such a backlight component.

The manufacturing of such components faces various challenges. One challenge is the embedding of the nanocrystals into the component. Due to the different chemical properties of the quantum dots, there might be incompatibilities between the various embedded materials comprising the quantum dots or even between quantum dots embedded within the same material. Such incompatibilities might lead to degradation of the materials in the display components and therefore the lifetime of such a display might be affected.

Luminescent crystal based components often deal with challenges regarding stability and brightness, wherein a good stability and high display brightness of these components is difficult to achieve.

The light conversion factor in that context refers to the ratio between the green light intensity emitted in perpendicular direction from the self-supporting film and the blue light intensity extincted (e.g. by absorption, reflection or scattering) in a direction perpendicular of the self-supporting.

The critical value related to display brightness is transmission haze that refers to the amount of light that is subject to Wide Angle Scattering, normally at an angle greater than 2.5° from normal incident direction (measured by ASTM D1003; e.g. with BYK Gardner haze meter) when passing a transparent or partially transparent material (the self-supporting film in this invention).

A technical effect of the low haze is the fact that the lower haze leads to a higher display brightness, measured as "light conversion factor" (LCF) of the self-supporting film.

The document EP 3 296 378 A1 discloses a composite luminescent material. The composite luminescent material comprises: a matrix; and perovskite nanoparticles. The perovskite nanoparticles are dispersed in the matrix, wherein the mass ratio of the perovskite nanoparticles matrix to the perovskite nanoparticles is 1:(1-50). The evaporation conditions of the organic solvent system can be controlled to manage the crystallization of the polymer matrices used, the arrangement of the additive, and the nucleation and growth of the perovskite nanoparticles. The haze of the material here is mainly defined by the partial crystallization of the polymers used. The haze here is an intrinsic property of the polymers used.

DISCLOSURE OF THE INVENTION

The problem to be solved by the present invention is therefore to provide a light emitting component that is manufactured in a way to prevent incompatibilities of quantum dot materials in light emitting components, in particular of LCD displays. In addition, the present invention overcomes the disadvantages of the prior art in terms of stability and brightness.

The present invention will be described in detail below. It is understood that the various embodiments, preferences and ranges as provided/disclosed in this specification may be combined at will. Further, depending of the specific embodiment, selected definitions, embodiments or ranges may not apply.

Unless otherwise stated, the following definitions shall apply in this specification:

The terms "a", "an" "the" and similar terms used in the context of the present invention are to be construed to cover both the singular and plural unless otherwise indicated herein or clearly contradicted by the context. The term "containing" shall include all, "comprising", "essentially consisting of" and "consisting of". Percentages are given as weight-%, unless otherwise indicated herein or clearly contradicted by the context. "Independently" means that one substituent/ion may be selected from one of the named substituents/ions or may be a combination of more than one of the above.

The term "phosphor" (LC) is known in the field and relates to materials that exhibits the phenomenon of luminescence, specifically fluorescent materials. Accordingly, a red phosphor is a material showing luminescence in the range of 610-650 nm, e.g. centered around 630 nm. Accordingly, a green phosphor is a material showing luminescence in the range of 500-550 nm, e.g. centered around 530 nm. Typically, phosphors are inorganic particles.

The term "luminescent crystal" (LC) is known in the field and relates to crystals of 3-100 nm, made of semiconductor materials. The term comprises quantum dots, typically in the range of 2-15 nm and nanocrystals, typically in the range of more than 15 nm and up to 100 nm (preferably up to 50 nm). Preferably, luminescent crystals are approximately isometric (such as spherical or cubic). Particles are considered approximately isometric, in case the aspect ratio (longest: shortest direction) of all 3 orthogonal dimensions is 1-2. Accordingly, an assembly of LCs preferably contains 50-100% (n/n), preferably 66-100% (n/n) much preferably 75-100% (n/n) isometric nanocrystals.

LCs show, as the term indicates, luminescence. In the context of the present invention the term luminescent crystal includes both, single crystals and polycrystalline particles. In the latter case, one particle may be composed of several crystal domains (grains), connected by crystalline or amorphous phase boundaries. A luminescent crystal is a semiconducting material which exhibits a direct bandgap (typically in the range 1.1-3.8 eV, more typically 1.4-3.5 eV, even more typically 1.7-3.2 eV). Upon illumination with electromagnetic radiation equal or higher than the bandgap, the valence band electron is excited to the conduction band leaving an electron hole in the valence band. The formed exciton (electron-electron hole pair) then radiatively recombines in the form of photoluminescence, with maximum intensity centered around the LC bandgap value and exhibiting photoluminescence quantum yield of at least 1%. In contact with external electron and electron hole sources LC could exhibit electroluminescence.

The term "quantum dot" (QD) is known and particularly relates to semiconductor nanocrystals, which have a diameter typically between 2-15 nm. In this range, the physical radius of the QD is smaller than the bulk excitation Bohr radius, causing quantum confinement effect to predominate. As a result, the electronic states of the QD, and therefore the bandgap, are a function of the QD composition and physical size, i.e. the color of absorption/emission is linked with the QD size. The optical quality of the QDs sample is directly linked with their homogeneity (more monodisperse QDs will have smaller FWHM of the emission). When QD reach size bigger than the Bohr radius the quantum confinement effect is hindered and the sample may not be luminescent any-more as nonradiative pathways for exciton recombination may become dominant. Thus, QDs are a specific subgroup of nanocrystals, defined in particular by its size and size distribution.

The term "perovskite crystals" is known and particularly includes crystalline compounds of the perovskite structure. Such perovskite structures are known per se and described as cubic, pseudocubic, tetragonal or orthorhombic crystals of general formula M1M2X3, where M1 are cations of coordination number 12 (cuboctaeder) and M2 are cations of coordination number 6 (octaeder) and X are anions in cubic, pseudocubic, tetragonal or orthorhombic positions of the lattice. In these structures, selected cations or anions may be replaced by other ions (stochastic or regularly up to 30 atom-%), thereby resulting in doped perovskites or nonstochiometric perovskites, still maintaining its original crystalline structure. The manufacturing of such luminescent crystals is known, e.g. from WO2018 028869.

The term "polymer" is known and includes organic and inorganic synthetic materials comprising repeating units ("monomers"). The term polymers includes homopolymers and co-polymers. Further, cross-linked polymers and non-cross-linked polymers are included. Depending on the context, the term polymer shall include its monomers and oligomers. Polymers include, by way of example, acrylate polymers, carbonate polymers, sulfone polymers, epoxy polymers, vinyl polymers, urethane polymers, imide polymers, ester polymers, furane polymers, melamine polymers, styrene polymers, norbornene polymers, silicone polymers and cyclic olefin copolymers. Polymers may include, as conventional in the field, other materials such as polymerization initiators, stabilizers, fillers, solvents.

Polymers may be further characterized by physical parameters, such as polarity, glass transition temperature Tg, Young's modulus and light transmittance.

Transmittance: Typically, polymers used in the context of this invention are light transmissive for visible light, i.e. non-opaque for allowing light emitted by the luminescent crystals, and possible light of a light source used for exciting the luminescent crystals to pass. Light transmittance may be determined by white light interferometry or UV-Vis spectrometry.

Glass transition temperature: (Tg) is a well-established parameter in the field of polymers; it describes the temperature where an amorphous or semi-crystalline polymer changes from a glassy (hard) state to a more pliable, compliant or rubbery state. Polymers with high Tg are considered "hard", while polymers with low Tg are considered "soft". On a molecular level, Tg is not a discrete thermodynamic transition, but a temperature range over which the mobility of the polymer chains increase significantly. The convention, however, is to report a single temperature defined as the mid-point of the temperature range, bounded by the tangents to the two flat regions of the heat flow curve of the DSC measurement. Tg may be determined according to DIN EN ISO 11357-2 or ASTM E1356 using DSC. This method is particularly suitable if the polymer is present in the form of bulk material. Alternatively, Tg may be deter-mined by measuring temperature-dependent micro- or nanohardness with micro- or nanoindentation according to ISO 14577-1 or ASTM E2546-15. This method is suited for luminescent components and lighting devices as disclosed herein. Suitable analytical equipment is available as MHT (Anton Paar), Hysitron TI Premier (Bruker) or Nano Indenter G200 (Keysight Technologies). Data obtained by temperature controlled micro- and nanoindentation can be converted to Tg. Typically, the plastic deformation work or Young's modulus or hardness is measured as a function of temperature and Tg is the temperature where these parameters change significantly.

Young's modulus or Young modulus or Elasticity modulus is a mechanical property that measures the stiffness of a solid material. It defines the relationship between stress (force per unit area) and strain (proportional deformation) in a material in the linear elasticity regime of a uniaxial deformation.

The term "scattering particles" is known and includes organic or inorganic particles having a refractive index different to the matrix where the scatter particles are incorporated. Due to this refractive index difference, light passing the matrix will be scattered or diffracted at the location of each scatter particle. Typical sizes of scatter particles are in the range of 20-20'000 nm, preferably 50-10'000 nm, much preferably 100-5'000 nm. As the the term particle implies, networks are excluded. Typically, the difference in refractive index ΔRI scattering particles—solid polymer is at least 0.02, preferably 0.1, much preferably 0.2. Typically, the amount of such scattering particles may vary over a broad range, suitable minimum concentrations are, for example, more than 0.01 wt %, preferably more than 0.1 wt %, most preferably 1 wt %. Suitable maximum concentrations are less than 30 wt %, preferably less than 15 wt %, much preferably less than 8 wt %. In case of self supporting films 50-5000 mg/m2, preferably 100-1000 mg/m2, such as 500 mg/m2.

According to the present invention, the above described problem is solved by a first aspect of the invention, a light emitting component comprising a light source, a first layer comprising red phosphor and a second layer comprising luminescent crystals.

The first layer is arranged adjacent to the light source. The term "layer" refers to all possible types how the red phosphor could be applied to the light source. In particular, if the red phosphor is applied as a film or as droplets or individual particles, this types of application of the red phosphor are covered by the term "layer". In particular, the layer does not need to be a continuous layer and does not need to be uniform.

In particular, the first layer can further be an assembly of quantum dots that are distributed adjacent to the light source.

The adjacent arrangement of the first layer to the light source means that the first layer is in close contact to a surface of the light source. Upon absorption of the blue light of the light source, the red phosphor of the first layer emits light in the red light spectrum. In particular, the red phosphor of the first layer emits light with a longer wavelength than the excitation wavelength of the light source.

The second layer comprises luminescent crystals of perovskite structure. Upon absorption of the light emitted by the light source, the luminescent crystals emit light of a wavelength in the green light spectrum. In particular, the luminescent crystals of the second layer emit light with a longer wavelength than the excitation wavelength of the light source.

The second layer has a haze $h_2$ of $20 \le h_2 \le 70\%$.

Advantageously, the second layer has a haze $h_2$ of $h_2$ of $10\% < h_2 < 100\%$.

Haze in the context of the present invention means transmission haze. Transmission haze is the amount of light that is subject to Wide Angle Scattering (At an angle greater than 2.5° from normal incident direction (measured by ASTM D1003; e.g. with Byk gardner haze meter) when passing a transparent material (the second layer in this invention).

The second layer is arranged remotely from the first layer. Remotely in this context means in particular that the second layer is arranged such that it does not get in contact with the first layer, or it does essentially not get in contact with the first layer. Remotely can further mean that the second layer is arranged in parallel to the first layer with a distance between the two.

In an advantageous embodiment of the invention, the second layer might comprise luminescent crystals, a polymer and scattering particles.

In this case, the haze in the second layer is generated by means of the scattering particles distributed in the polymer.

Advantageously, luminescent crystals are embedded in a cross-linked polymer, in particular a solid cross-linked polymer. Typically, such crosslinked-polymers are transparent with a low haze of <10%.

The haze of the cross-linked polymer might be increased by incorporating scattering particles into such polymers.

Advantageously, the light emitting component comprises luminescent crystals, wherein the luminescent crystals are selected from compounds of formula (II):

$$[M^1A^1]_aM^2_bX_c \quad \text{(II), wherein:}$$

$A^1$ represents one or more organic cations, preferably formamidinium, $M^1$ represents one or more alkaline metals, $M^2$ represents one or more metals other than $M^1$, in particular Pb, X represents one or more anions selected from the group consisting of halides, pseudohalides and sulfides, in particular Br, a represents 1-4, b represents 1-2, c represents 3-9, and wherein either $M^1$, or $A^1$, or $M^1$ and $A^1$ being present.

Further advantageously, a concentration of Pb is of 5-200 mg/m$^2$, in particular 10-100 mg/m$^2$, very particular 20-80 mg/m$^2$, In particular, the first layer is arranged between the light source and the second layer.

In particular, there is an air gap between the second layer and the first layer or the red phosphor respectively. The gap might also be a vacuum gap or a gap filled with another gas.

In particular, the second layer is arranged in parallel to the first layer.

In particular, the second layer is arranged such that there is an air gap between the first layer and the second layer, but such that there are supporting points between the first layer and the second layer to keep the second layer in a specific distance to the first layer.

In particular, the second layer is arranged such that there is essentially an air gap between the first layer and the second layer but there might still be touching points between the first and the second layer.

The particular arrangement of the one or more light sources, the first layer and the second layer impede incompatibilities between the individual materials thereof, in particular between the materials of the first and the second layer.

For an advantageous embodiment, the light source, the first layer and the second layer are arranged in said order in a vertical alignment.

In particular, the second layer might be arranged remotely to more than one light source and/or to more than one first layer.

In particular, the second layer might be arranged remotely to more than one light source, wherein each light source comprises its respective first layer adjacent to the respective light source.

In an advantageous embodiment of the invention, the second layer has a haze $h_2$ of $h_2 \le 80\%$, preferably $\le 70\%$, most preferably 60%.

In another advantageous embodiment of the invention, the second layer has a haze $h_2$ of $10 \le h_2 \le 80\%$, preferably $20 \le h_2 \le 70\%$, most preferably $30 \le h_2 \le 60\%$.

The low haze of the second layer has the technical effect that the luminescent perovskite crystals in the second layer are more stable, in particular if they are exposed to a blue light source. The stability is a result of the reduced multiplex scattering of the blue light in the second layer due to the lower haze.

In addition, a further technical effect of the low haze is the fact that the lower haze leads to a higher display brightness, measured as "light conversion factor" (LCF) of the second layer. The light conversion factor of the second layer refers to the ratio between the green light intensity emitted in perpendicular direction from the second layer and the blue light intensity extincted (e.g. by absorption, reflection or scattering) in perpendicular direction from the second layer.

In a further advantageous embodiment of the invention, the red phosphor is selected from one or more of core-shell quantum dots and/or is based on In or Cd, preferably on InP or CdSe respectively. The shell typically comprises ZnS or ZnSeS.

In a further advantageous embodiment of the invention, the core-shell quantum dots have a platelet structure. Preferably, such platelet structured dots are based on CdSe.

In a further advantageous embodiment of the invention, the core-shell quantum dots comprise a CdSe core which is doped with Zn. Such doping, sometimes also referred- to as alloying, reduces the amount of Cd per quantum dot.

Advantageously, the red phosphor is a Mn+4 doped phosphor of formula (I):

$$A_x[MF_y]:Mn^{4+} \quad \text{(I), wherein:}$$

A represents Li, Na, K, Rb, Cs or a combination thereof,

M represents Si, Ge, Sn, Ti, Zr, Al, Ga, In, Sc, Y, La, Nb, Ta, Bi, Gd, or a combination thereof, x represents an absolute value of the charge of the $[MF_y]$ ion; and Y represents 5, 6 or 7, in particular, wherein the red phosphor is of formula (I):

$$K_2SiF_6:Mn^{4+}.$$

In a further advantageous embodiment of the light emitting component, the perovskite luminescent crystals are selected from compounds of formula (II):

$[M^1A^1]_aM^2_bX_c$ (II), wherein:

$A^1$ represents one or more organic cations, preferably formamidinium (FA), $M^1$ represents one or more alkaline metals, $M^2$ represents one or more metals other than M1, in particular Pb, X represents one or more anions selected from the group consisting of halides, pseudohalides and sulfide, in particular Br, a represents 1-4, b represents 1-2, c represents 3-9, and wherein either $M^1$, or $A^1$, or $M^1$ and $A^1$ being present.

In particular, formula (II) describes perovskite luminescent crystals which, upon absorption of the light emitted by the light source, emit light of a wavelength in the green light spectrum between 500 nm and 550 nm, in particular centred around 527 nm.

In particular, formula (II) describes luminescent crystals where X represents halides or pseudohalides, e.g. Br, Cl, CN, in particular Br.

In particular, formula (II) describes luminescent crystals wherein $M^2$ represents Pb.

In particular, formula (II) describes luminescent crystals, wherein $A^1$ represents FA (formamidinium) and $M^1$ is not present.

Advantageously, the luminescent crystals are further embedded in a solid polymer. Suitable are particularly polymers, where the repeating units of said polymer comply with the following: [O atoms+N atoms]/[C atoms]<0.9. Preferably, this value is <0.4, more preferably <0.3, most preferably <0.25.

In a further advantageous embodiment, such a solid polymer comprises an acrylate. Very preferably, the polymer comprises or consists of repeating units selected from the group of cyclic aliphatic acrylates (monofunctional acrylates).

In another advantageous embodiment, the solid polymer is cross-linked and comprises a multifunctional acrylate. In addition to the monofunctional acrylates.

In a further advantageous embodiment, the solid polymer has a glass transition temperature $T_g$ of $T_g \leq 120°$ C. (preferably $T_g \leq 100°$ C., very preferably $T_g \leq 80°$ C., very preferably $T_g \leq 70°$ C.). Each $T_g$ is measured according to DIN EN ISO 11357-2:2014-07 during the second heating cycle and applying a heating rate of 20 K/min, starting at −90° C. up to 250° C.

In a further advantageous embodiment, such a solid polymer is configured as a sheet-like polymer. The sheet-like polymer can have the shape of a polymer film with a film thickness of typically 0.001-10 mm, most typically 0.01-0.5 mm. The sheet-like polymer can either be continuous and flat or discontinuous with e.g. a microstructure (e.g. with prism-shape).

In a further advantageous embodiment, the solid polymer is sandwiched between two barrier layers. In particular, such sandwich arrangement refers to an arrangement in a horizontal direction with a barrier layer, the polymer and another barrier layer. The two barrier layers of the sandwich structure can be made of the same barrier layer material or of different barrier layer materials.

The technical effect of the barrier layers is to improve the stability of the luminescent perovskite crystals, in particular against oxygen or humidity.

In particular, such barrier layers are known in the field; typically comprising a material/a combination of materials with low water vapour transmission rate (WVTR) and/or low oxygen transmission rate (OTR). By selecting such materials, the degradation of the LCs in the component in response to being exposed to water vapor and/or oxygen is reduced or even avoided. Barrier layers or films preferably have a WVTR<10 (g)/(m^2*day) at a temperature of 40° C./90% r.h. and atmospheric pressure, more preferably less than 1 (g)/(m^2*day), and most preferably less than 0.1 (g)/(m^2*day).

In one embodiment, the barrier film may be permeable for oxygen. In an alternative embodiment, the barrier film is impermeable for oxygen and has an OTR (oxygen transmission rate)<10 (mL)/(m^2*day) at a temperature of 23° C./90% r.h. and atmospheric pressure, more preferably <1 (mL)/(m^2*day), most preferably <0.1 (mL)/(m^2*day).

In one embodiment, the barrier film is transmissive for light, i.e. transmittance visible light >80%, preferably >85%, most preferably >90%.

Suitable barrier films may be present in the form of a single layer. Such barrier films are known in the field and contain glass, ceramics, metal oxides and polymers. Suitable polymers may be selected from the group consisting of polyvinylidene chlorides (PVdC), cyclic olefin copolymer (COC), ethylene vinyl alcohol (EVOH), high-density polyethylene (HDPE), and polypropylene (PP); suitable inorganic materials may be selected from the group consisting of metal oxides, SiOx, SixNy, AlOx. Most preferably, a polymer humidity barrier material contains a material selected from the group of PVdC and COC.

Most advantageously, a polymer oxygen barrier material contains a material selected from EVOH polymers.

Suitable barrier films may be present in the form of multilayers. Such barrier films are known in the field and generally comprise a substrate, such as PET with a thickness in the range of 10-200 μm, and a thin inorganic layer comprising materials from the group of SiOx and AlOx or an organic layer based on liquid crystals which are embedded in a polymer matrix or an organic layer with a polymer having the desired barrier properties. Possible polymers for such organic layers comprise for example PVdC, COC, EVOH.

In a further advantageous embodiment of the invention, a diffusor film or diffusor plate is arranged in between the first layer and the second layer.

In a further advantageous embodiment of the invention, a light guide plate and a diffusor film are arranged between the first layer and the second layer of the invention. Advantageously, the light emitted from the light source and the first layer enters the light guide plate in an angle of 90° in respect of the light that is emitted by the light guide plate to the diffusor film and finally excites the luminescent crystals in the second layer.

In a further advantageous embodiment of the invention, a diffusor sheet is arranged between the first layer and the second layer of the invention. Advantageously, the light emitted from the light source and the first layer enters the diffusor plate in an angle of 0° in respect of the light that is emitted by the light guide plate to the diffusor sheet and finally excites the luminescent crystals in the second layer.

A second aspect of the invention refers to a light emitting device comprising the light emitting component according to the first aspect. In particular, such a light emitting device is a liquid crystal display (LCD).

In an advantageous embodiment of the invention, the light emitting component of the light emitting device comprises an array of more than one light source, wherein each light source has a respective adjacent first layer arranged adjacent to the particular light source, such that an array of light sources with their respective first layers forms. A second layer is arranged remotely to the array. The second layer is arranged such that an air gap forms between the first layers of the array and the second layer. The array covers essentially the full liquid crystal display area.

In an advantageous embodiment, each light source of the array of the one or more light sources is covered with the respective adjacent first layer, therefore building an array with individual light sources and their respective adjacent first layer.

Advantageously, the second layer can be formed in one piece to cover at least part of the array or the full array of individual light sources of the array of one or more light sources and their respective adjacent first layer, wherein the second layer is arranged remotely from the array of individual light sources and their respective first layers.

In another advantageous embodiment, the second layer can be formed by multiple layer pieces that cover at least a part of the array or the full array of light sources with their respective first layers, wherein all multiple layer pieces of the second layer are arranged remotely from the array of light sources with their respective first layers.

In a further advantageous embodiment of the invention, the one or more of the light sources of the array are each adapted to switch between on and off with a frequency f of f≥150 Hz, preferably of f≥300 Hz, very preferably of f≥600 Hz.

A third aspect of the invention refers to a self-supporting film comprising luminescent crystals. The luminescent crystals are of perovskite structure and emit green and/or red light in response to excitation by light of a wavelength shorter than the emitted light. The self-supporting film has a haze $h_2$ of $h_2$ of $20 \le h_2 \le 70\%$, preferably $h_2 < 80\%$, preferably <70%, most preferably <60%.

In another advantageous embodiment of the invention, the self-supporting film has a haze (measured with BYK gardner haze meter) $h_2$ of $10 \le h_2 \le 80\%$, most preferably $30 \le h_2 \le 60\%$.

In another advantageous embodiment of the invention, the self-supporting film has a transmittance (measured with BYK gardner haze meter) of >75%, preferably >85%, most preferably >90%.

In an advantageous embodiment of the invention, the luminescent crystals are characterized in that the luminescent crystals are embedded in a cross-linked polymer, in particular a solid cross-linked polymer.

In a further advantageous embodiment of the invention, the the luminescent crystals (20) are selected from compounds of formula (II):

$$[M^1A^1]_a M^2_b X_c \quad \text{(II), wherein:}$$

$A^1$ represents one or more organic cations, preferably formamidinium (FA), $M^1$ represents one or more alkaline metals, $M^2$ represents one or more metals other than $M^1$, in particular Pb, X represents one or more anions selected from the group consisting of halides, pseudohalides and sulfides, in particular Br, a represents 1-4, b represents 1-2, c represents 3-9, and wherein either $M^1$, or $A^1$, or $M^1$ and $A^1$ being present.

Further advantageously, $M^2$ represents Pb, and the concentration of Pb is of 5-200 mg/m2, in particular 10-100 mg/m2, very particular 20-80 mg/m2.

In another advantageous embodiment of the invention, the self-supporting film is comprising scattering particles, preferably selected from polymeric compositions, most preferably from organopolysiloxane.

Typical sizes of scatter particles are in the range of 20-20'000 nm, preferably 50-10'000 nm, much preferably 100-5'000 nm. Typically, the amount of such scattering particles may vary over a broad range, suitable minimum concentrations are, for example, more than 0.01 wt %, preferably more than 0.1 wt %, most preferably 1 wt %. Suitable maximum concentrations are less than 30 wt %, preferably less than 15 wt %, much preferably less than 8 wt %. In case of self supporting films 50-5000 mg/m2, preferably 100-1000 mg/m2, such as 500 mg/m2.

In a further advantageous embodiment of the self-supporting film, the solid polymer is a polymer as referred to in the first aspect of the present invention.

Advantageously, such polymer comprises an acrylate, in particular comprises or consists of repeating units selected from the group of cyclic aliphatic acrylates, in particular, and/or wherein the acrylate comprises repeating units selected from monofunctional acrylate monomers and multifunctional acrylate monomers.

In a further advantageous embodiment, the solid polymer is characterized by a molar ratio of the sum of (oxygen+nitrogen) to carbon <0.9, preferably <0.4, preferably <0.3, most preferably <0.25.

In a further advantageous embodiment, the solid polymer has a glass transition $T_g$ of $T_g \le 120°$ C. (preferably $T_g \le 100°$ C., very preferably $T_g \le 80°$ C., very preferably $T_g \le 70°$ C.);

whereby each $T_g$ is measured according to DIN EN ISO 11357-2:2014-07 during the second heating cycle and applying a heating rate of 20 K/min, starting at −90° C. up to 250° C.

In addition, an in an advantageous embodiment, the polymer might be a sheet-like polymer.

In a further advantageous embodiment, the polymer is sandwiched between two barrier layers.

Advantageously, the self-supporting film comprises luminescent crystals that emit red light in response to the excitation by light of a wavelength shorter than the emitted light.

A fourth aspect of the invention refers to a light emitting device, in particular a liquid crystal display (LCD), comprising the self-supporting film according to the third aspect.

Other advantageous embodiments are listed in the dependent claims as well as in the description below.

BRIEF DESCRIPTION OF THE DRAWINGS

The invention will be better understood and objects other than those set forth above will become apparent from the following detailed description thereof. Such description makes reference to the annexed drawings, wherein.

MODES FOR CARRYING OUT THE INVENTION

Figure 1C:
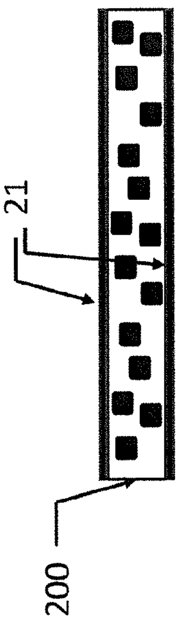
FIG. 1*c* shows a schematic figure of a self-supporting film according to an embodiment of the invention.
Figure 1B:
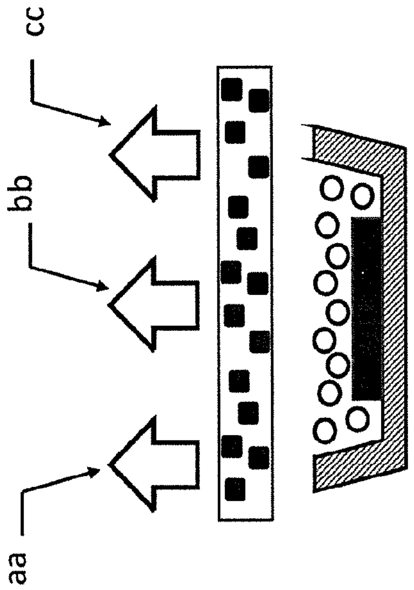
FIG. 1*b* shows a schematic figure of a light emitting component according to an advantageous embodiment of the invention.
Figure 1A:
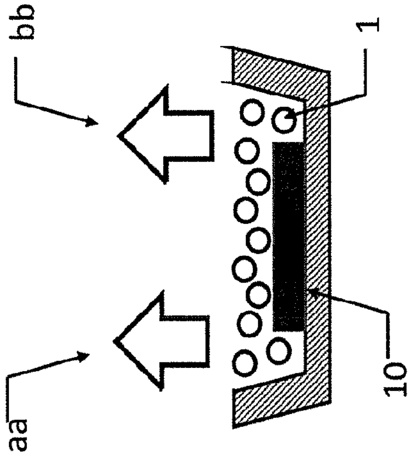
FIG. 1*a* shows a schematic figure of a light source for emitting blue light with a first layer comprising red phosphor.

Embodiments, examples, experiments representing or leading to embodiments, aspects and advantages of the invention will be better understood from the following detailed description thereof. Such description makes reference to the annexed drawings, wherein:

FIG. 1*a* shows a schematic of a component comprising comprises a light source 10 for emitting blue light aa and a first layer 1 comprising red phosphor emitting red light bb. Advantageously, the red phosphor particles of the red layer 1 are selected from core-shell CdSe QDs, core-shell InP QDs, KSF phosphor ($K_2SiF_6:Mn^{4+}$). Upon absorption of the blue light aa, the red phosphor emits light in the red light spectrum bb.

In particular, the component shown in FIG. 1*b* shows the arrangement of the light source 10 and the first layer 1 that is adjacent to the light source 10. In this schematic, the first layer 1 comprises red phosphor particles that are distributed adjacent to the light source 10.

FIG. 1*b* shows a schematic of a light emitting component according to an advantageous embodiment of the invention. The light emitting component comprises a light source 10 for emitting blue light, a first layer 1 comprising red phosphor and a second layer 2 comprising luminescent crystals 20. The red phosphor of the first layer 1, upon absorption of the blue light aa, emits light in the red light spectrum bb. The first layer 1 is arranged adjacent to the light source 10. The luminescent crystals 20 of the second layer 2 are of perovskite structure. Upon absorption of the light emitted by the light source 10, the luminescent crystals 20 emit light of a wavelength in the green light spectrum cc. The second layer 2 has a haze $h_2$ of $10\% \leq h_2 \leq 100\%$. The second layer 2 is arranged remotely from the first layer 1. In particular, there is an air gap between the second layer 2 and the first layer 1.

In a further advantageous embodiment, the light emitting component in FIG. 1*b* might have a haze $h_2$ of $20 \leq h_2 \leq 70\%$, preferably $h_2 \leq 80\%$, preferably $h_2 \leq 70\%$, very preferably $h_2 \leq 60\%$.

Advantageously for this embodiment, the red phosphor is selected from one or more of core-shell quantum dots based on In or Cd; in particular based on InP (III) or CdSe (IV) respectively.

Further advantageously, the red phosphor is a Mn+4 doped phosphor of formula (I) as described above. An example of such an embodiment is disclosed in the experimental section (experiment 1).

Figure 2:
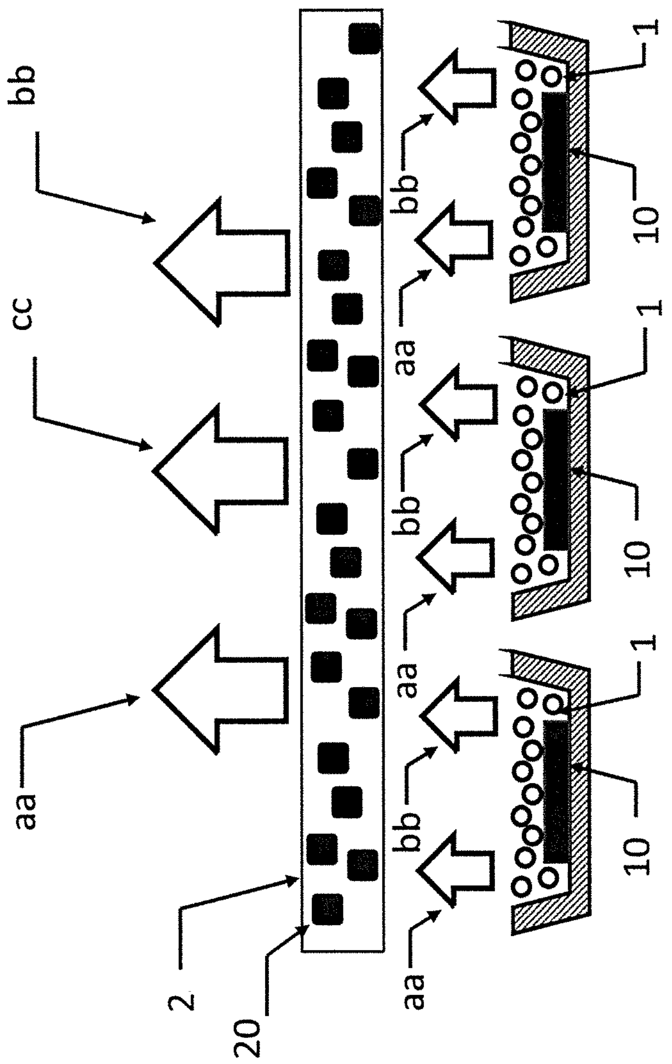
FIG. 2 shows a schematic figure of a light emitting component according to a further advantageous embodiment of the invention.

In a further advantageous embodiment of FIG. 2, the luminescent crystals 20 are selected from compounds of formula (II) as disclosed above. An example of such an embodiment is disclosed in the experimental section (experiment 2).

In a further advantageous embodiment, the luminescent crystals 20 are selected from the compounds of formula (II), wherein $M^2$ is Pb and wherein the concentration of Pb is 5-200 mg/$m^2$, in particular 10-100 mg/$m^2$, very particular 20-80 mg/$m^2$.

Advantageously, the luminescent crystals 20 are embedded in a solid polymer, in particular wherein the polymer comprises an acrylate, very particular wherein the polymer comprises a cyclic aliphatic acrylate (monofunctional acrylates).

In another advantageous embodiment, the solid polymer is cross-linked and comprises a multifunctional acrylate. In addition to the monofunctional acrylates.

Such a polymer might further be configured as a sheet-like polymer.

In a further advantageous embodiment, the polymer can be sandwiched between barrier layers 21. An example of such barrier layers 21 are shown in FIG. 1*c*.

In a further advantageous embodiment the solid polymer has a glass transition temperature $T_g$ of $T_g \leq 120°$ C. (preferably $T_g \leq 100°$ C., very preferably $T_g \leq 80°$ C., very preferably $T_g \leq 70°$ C.)

In a further advantageous embodiment, the second layer might scattering particles embedded in the solid polymer, in particular for generating said haze (scattering particles are not shown in the figures).

FIG. 1*c* shows a schematic of an embodiment of the self-supporting film 200. The self-supporting film comprises luminescent crystals 20 embedded in a polymer, wherein the luminescent crystals 20 are of perovskite structure and emit green cc and/or red light bb in response to excitation by light of a wavelength shorter than the emitted light, and wherein the self-supporting film has a haze $h_2$ of $20 \leq h_2 \leq 70\%$, preferably $h_2 < 80\%$, in particular of $h_2 < 70\%$, very particular of $h_2 < 60\%$.

Advantageously, the self-supporting film 200 comprises scattering particles embedded in the polymer (scattering particles are not shown in the figure).

In a further embodiment, the luminescent crystals 20 of the self-supporting film 200 are embedded in a cross-linked solid polymer.

In a further advantageous embodiment, the luminescent crystals 20 are selected from the compounds of formula (II).

In a further advantageous embodiment, the luminescent crystals 20 are selected from the compounds of formula (II), wherein $M^2$ is Pb and wherein the concentration of Pb is 5-200 mg/$m^2$, in particular 10-100 mg/$m^2$, very particular 20-80 mg/$m^2$.

In a further advantageous embodiment, the solid polymer comprises an acrylate, in particular comprises or consists of repeating units selected from the group of cyclic aliphatic acrylates, in particular, and/or wherein the acrylate comprises repeating units selected from monofunctional acrylate monomers and multifunctional acrylate monomers.

In a further advantageous embodiment of the self-supporting film 200, the solid polymer is characterized by a molar ratio of the sum of (oxygen+nitrogen) to carbon<0.9, preferably <0.4, preferably <0.3, most preferably <0.25.

In a further advantageous embodiment, the solid polymer has a glass transition temperature $T_g$ of $T_g \leq 120°$ C., in particular of $T_g \leq 100°$ C., in particular of $T_g \leq 80°$ C., in particular of $T_g \leq 70°$.

In a further advantageous embodiment, the solid polymer is configured as a sheet-like polymer and/or wherein the solid polymer is sandwiched between two barrier layers 21.

FIG. 2 shows a schematic of a further embodiment of the light emitting component. The light emitting component comprises a light source 10 for emitting blue light, a first layer 1 comprising red phosphor and a second layer 2 comprising luminescent crystals 20. The red phosphor of the first layer 1, upon absorption of the blue light aa, emits light in the red light spectrum bb. The first layer 1 is arranged adjacent to the light source 10. The luminescent crystals 20 of the second layer 2 are of perovskite structure. Upon absorption of the light emitted by the light source 10, the luminescent crystals 20 emit light of a wavelength in the green light spectrum cc. The second layer 2 has a haze $h_2$ of $40\% \leq h_2 \leq 90\%$. The second layer 2 is arranged remotely from the first layer 1. In particular, there is an air gap between the second layer 2 and the first layer 1.

In this embodiment, not only one but multiple light sources 10 and their respective first layers 1 are arranged in an array, wherein the second layer 2 that serves as the second layer 2 for all light sources 10 and their respective first layer 1, is formed in one piece.

All advantageous features as disclosed in FIG. 1*b* can also be combined with the embodiment in FIG. 1*c*.

Figure 3:
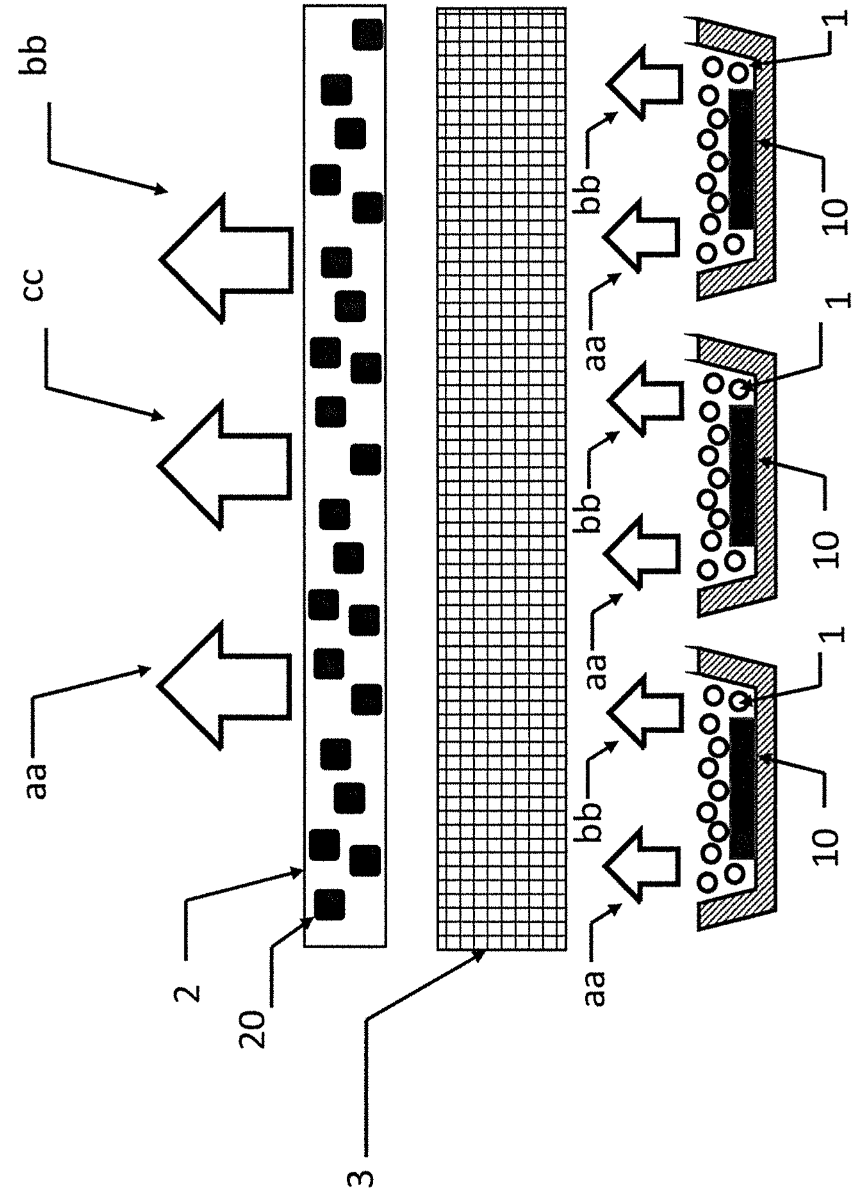
FIG. 3 shows a schematic of a light emitting component according to a further advantageous embodiment of the invention.

FIG. 3 shows a schematic of a light emitting component for a specific backlight architecture, in particular for LCD displays. In addition to the schematic in FIG. 2, there is a diffusor plate 3 arranged between the first layer 1 and the second layer 2.

Figure 4:
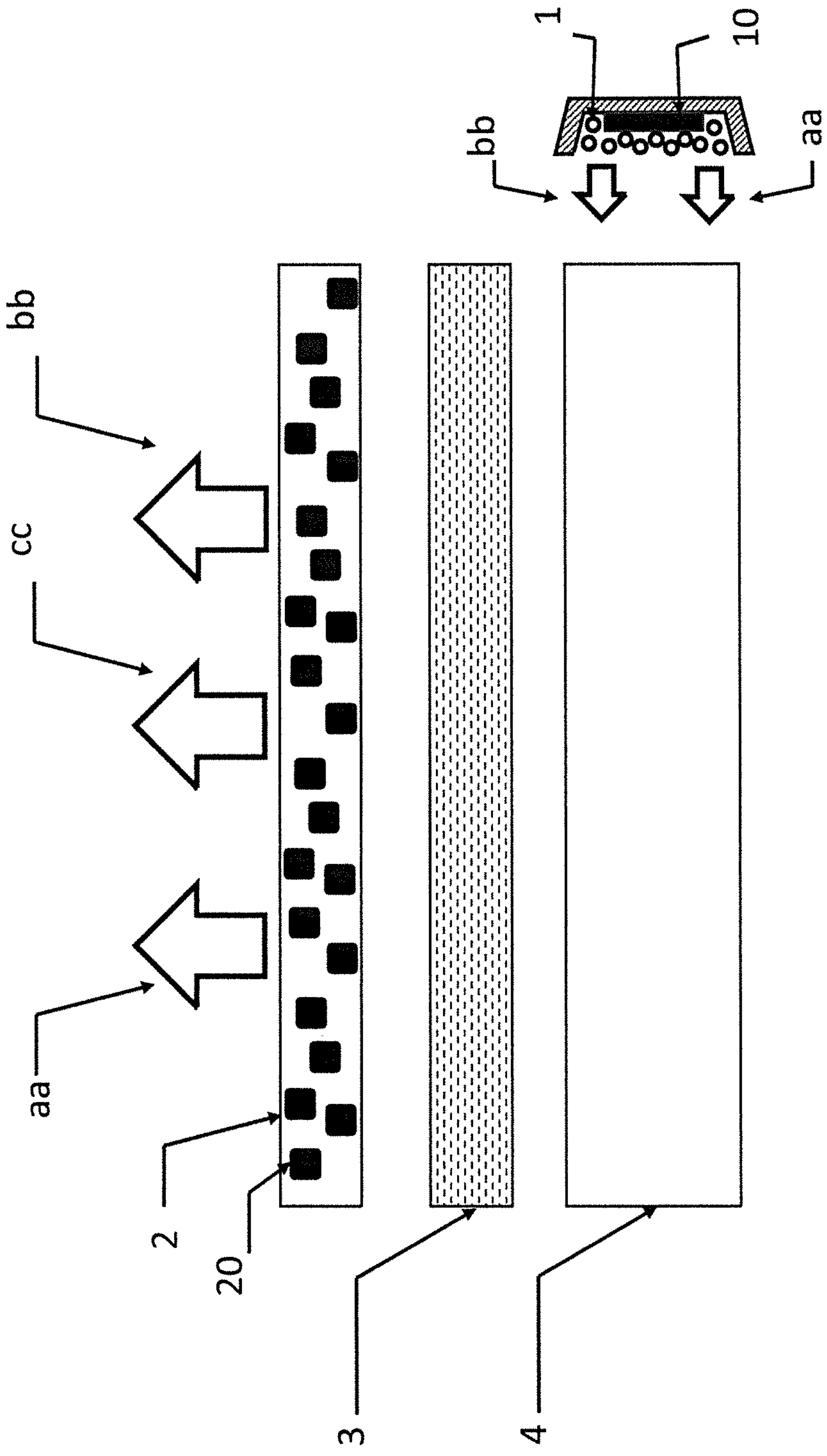
FIG. 4 shows a schematic of a light emitting component according to a further advantageous embodiment of the invention.

FIG. 4 shows a further schematic of a further light emitting device for a specific backlight architecture, in particular for LCD displays. The device comprises a light emitting component with a light source 10 for emitting blue light aa, a first layer 1 comprising red phosphor, and a second layer 2 comprising luminescent crystals 20. The first layer 1 is arranged adjacent to the light source 10. The second layer 2 is arranged remotely from the first layer 1. A diffusor film 3 and a light guide plate (LGP) 4 are arranged in between the first layer 1 and the second layer 2. In particular, the light source 10 and the first layer 1 are arranged such that blue aa and the red bb light enter the LGP 4 in an angle of 90° in regard of the light emitted by the LGP 4 that excites the luminescent crystals 20 of the second layer 2. Anyway, the light source 20 might in another advantageous embodiment be arranged such that the light enters the LGP in an angle of 0°.

Figure 5:
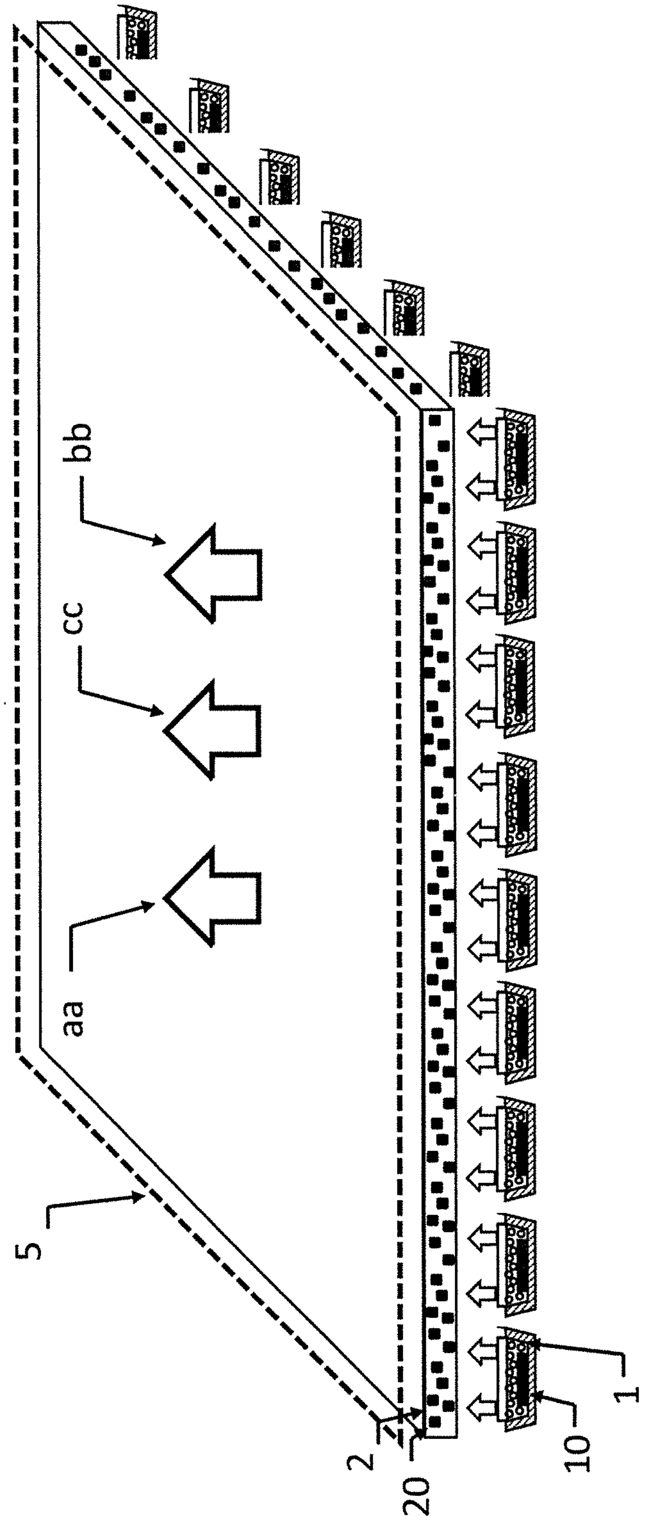
FIG. 5 shows a light emitting device according to an advantageous embodiment of the invention.

FIG. 5 discloses a schematic of an advantageous light emitting device according to an embodiment of the invention. The light emitting device, in particular an liquid crystal display comprises the light emitting component, e.g. as shown in one of the embodiments in FIGS. 1 to 4.

An advantageous light emitting device comprises a light emitting component comprising an array of one or more, in particular more than one, light sources 10. Each light source 10 comprises its respective first layer 1 arranged adjacent to the light source 10. In addition, such an embodiment comprises one second layer 2 arranged remotely to the array. In particular, the array covers essentially the full liquid crystal display area 5.

A further advantageous light emitting device comprises the one or more of the light sources 10 of the array, wherein each light source 10 is adapted to switch between on and off with a frequency f of f≥150 Hz, in particular of f≥300 Hz, very particular of f≥600 Hz.

Figure 6B:
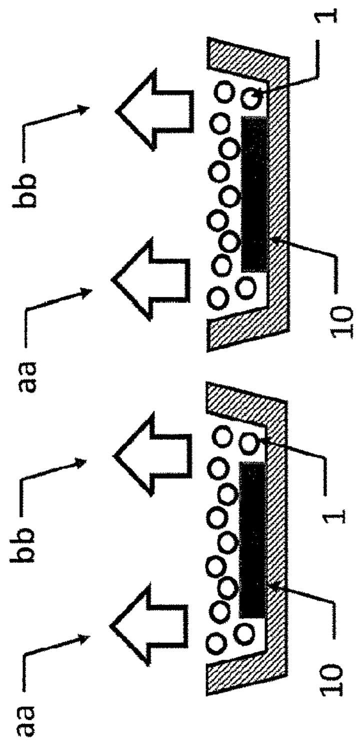
FIG. 6*a* shows an emission spectrum of the device schematically shown in FIG. 6*b*.
Figure 6A:
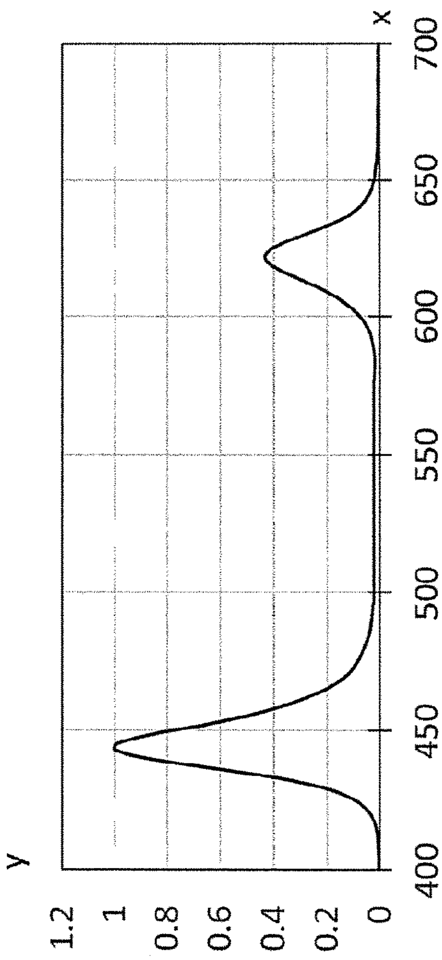

FIG. 6*a* shows an emission spectrum of an embodiment of a light emitting component according to the invention as shown schematically in FIG. 6*b*. The light emitting component comprises multiple light sources 10 for emitting blue light aa, each light source comprises a respective first layer 1 comprising red phosphor and upon absorption of the blue light aa, the red phosphor emits light in the red light spectrum bb. The red phosphors are arranged adjacent to the respective light source 10.

Figure 7B:
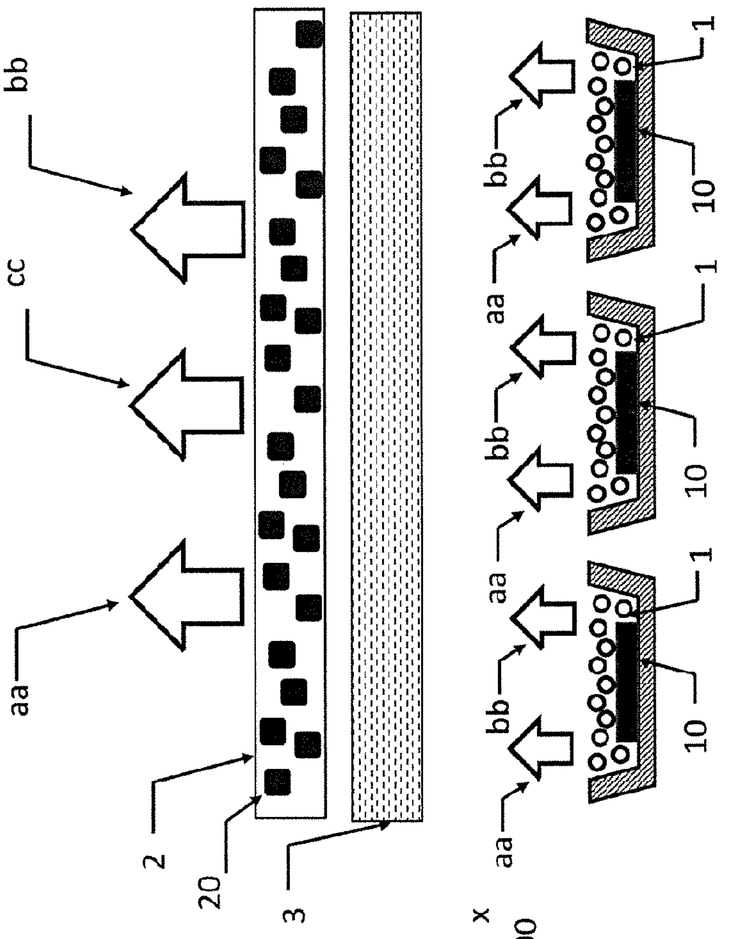
FIG. 7*a* shows an emission spectrum of the device schematically shown in FIG. 7*b*.

As shown in FIG. 7*b*, a second layer 2 comprising luminescent crystals 20 is arranged remotely to the multiple light sources 10 and their respective first layers 1. Upon absorption of the light emitted by the light sources 10, the luminescent crystals 20 emit light of a wavelength in the green light spectrum cc. The second layer 2 has a haze of 10%<h2<100%.

Figure 7A:
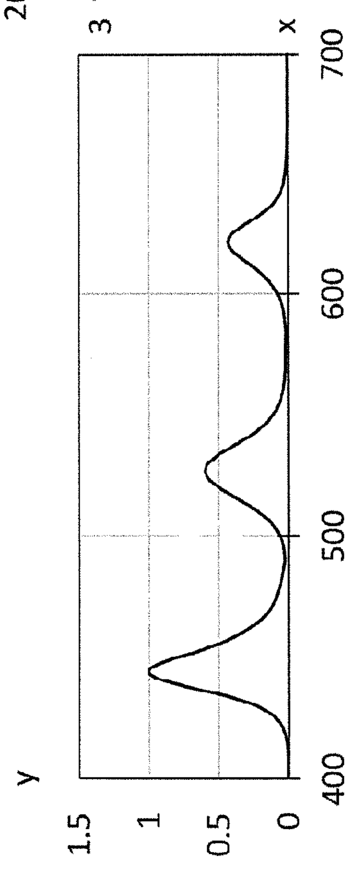

Accordingly, the emission spectrum shown in FIG. 7*a* of the light emitting device shows peaks in the range of the blue, green and red visible light.

EXPERIMENTAL SECTION

Example 1

Preparation of a backlight unit for a LCD display by using a component as described herein FIG. 6*b* shows the schematic of a component of an array for which the emission spectrum was measured as is shown in FIG. 6*a*. The component in FIG. 6*b* comprises a light source 10 for emitting blue light aa and a first layer 1 comprising red phosphor emitting red light bb. Advantageously, the red phosphor particles of the red layer 1 are selected from core-shell CdSe QDs, core-shell InP QDs, KSF phosphor ($K_2SiF_6$:$Mn^{4+}$). Upon absorption of the blue light aa, the red phosphor emits light in the red light spectrum bb.

The emission spectrum of the component shows peaks in the visible blue and red range of the spectrum.

In particular, the component shown in FIG. 1*b* shows the arrangement of the light source 10 and the first layer 1 that is adjacent to the light source 10. In this schematic, the first layer 1 comprises red phosphor particles that are distributed adjacent to the light source 10.

To measure the data, a 2D-array of 200 individual LEDs was used whereby the LEDs comprised a blue emitting gallium nitride chip and red emitting core-shell cadmium selenide quantum dots which were deposited directly on the blue LED chip (on-chip). The emission spectrum of this LED array is shown in FIG. 6*a*.

Example 2

The array from Example 1 was taken and additionally, a diffuser plate 3 is placed on top of the array of light sources with their respective first layer adjacent to the respective light source. The diffusor plate serves to homogeneously distribute the generated light of the LEDs, similar to the light emitting component as shown in FIG. 3.

In addition, a green remote perovskite QD film (self-supporting film in accordance with example 3) is placed on top of the diffusor plate (only loose placement; no glueing or similar). Then two crossed prism films (crossed BEFs) and a brightness enhancement film (DBEF) are placed on top of the green perovskite film (not shown in the Figure). The emission spectrum of the complete backlight structure is measured with a spectrometer (Konica Minolta CS-2000) showing blue, red and green emission peaks, as shown in FIG. 7*a*.

Example 3

Preparation of a green remote perovskite QD film as a self-supporting film, in accordance with the 3rd aspect of the invention, with low haze $h_2$ and low $T_g$:

Green perovskite QDs with composition formamidinium lead tribromide ($FAPbBr_3$) are synthesized in toluene as follows: Formamidinium lead tribromide ($FAPbBr_3$) was synthesized by milling $PbBr_2$ and FABr. Namely, 16 mmol $PbBr_2$ (5.87 g, 98% ABCR, Karlsruhe (DE)) and 16 mmol FABr (2.00 g, Greatcell Solar Materials, Queanbeyan, (AU)) were milled with Yttrium stabilized zirconia beads (5 mm diameter) for 6 h to obtain pure cubic $FAPbBr_3$, confirmed by XRD. The orange $FAPbBr_3$ powder was added to Oleylamine (80-90, Acros Organics, Geel (BE)) (weight ratio $FAPbBr_3$:Oleylamine=100:15) and toluene (>99.5%, puriss, Sigma Aldrich). The final concentration of $FAPbBr_3$ was 1 wt %. The mixture was then dispersed by ball milling using yttrium stabilized zirconia beads with a diameter size of 200 μm at ambient conditions (if not otherwise defined, the atmospheric conditions for all experiments are: 35° C., 1 atm, in air) for a period of 1 h yielding an ink with green luminescence.

Film formation: 0.1 g of the green ink was mixed with an UV curable monomer/crosslinker mixture (0.7 g FA-513AS, Hitachi Chemical, Japan/0.3 g Miramer M240, Miwon, Korea) containing 1 wt % photoinitiator Diphenyl(2,4,6-trimethylbenzoyl) phosphine oxide (TCI Europe, Netherlands) and 2 wt % polymeric scattering particles (Organopolysiloxane, ShinEtsu, KMP-590) in a speed mixer and the toluene was evaporated by vacuum (<0.01 mbar) at room temperature. The resulting mixture contained 500 ppm Pb as measured with inductively coupled optical emission spectroscopy (ICP-OES) and was then coated with 50 micron layer thickness on a 100 micron barrier film (supplier: I-components (Korea); Product: TBF-1007), then laminated with a second barrier film of the same type. Afterwards the laminate structure was UV-cured for 60 s (UVAcube100 equipped with a mercury lamp and quartz filter, Hoenle, Germany). The initial performance of the as obtained green perovskite QD film shows an emission wavelength of 526 nm, a FWHM of 22 nm and a color coordinate in Y-direction ("y-value", CIE1931) of y=0.15 when placed on a blue LED light source (450 nm emission wavelength) with two crossed prism sheets (X-BEF) and one brightness enhancement film (DBEF) on top of the QD film (optical properties measured with a Konica Minolta CS-2000). The haze of the obtained QD film is 50% and the transmittance is 85% (measured with Byk Gardner haze meter). The light conversion factor (LCF; LCF=emitted green intensity (integrated emission peak) divided by the reduction of the blue intensity (integrated emission peak); measured with perpendicular emission of green and blue from the QD film by using a Konica Minolta CS-2000).

The glass transition temperature Tg of the UV-cured resin composition was determined by DSC according to DIN EN ISO 11357-2:2014-07 with a starting temperature of −90° C. and an end temperature of 250° C. and a heating rate of 20 K/min in nitrogen atmosphere (20 ml/min). The purging gas was nitrogen (5.0) at 20 ml/min. The DSC system DSC 204 F1 Phoenix (Netzsch) was used. The $T_g$ was determined on the second heating cycle (the first heating from −90° C. to 250° C. showed overlaying effects besides the glass transition). For the DSC measurement the UV-cured resin composition was removed from the QD film by delaminating the barrier films. The measured Tg of the UV-cured resin composition was 75° C.

The stability of the QD film was tested for 1'000 hours under blue LED light irradiation by placing the QD film into a light box with high blue intensity (supplier: Hoenle; model: LED CUBE 100 IC) with a blue flux on the QD film of 220 mW/cm2 at a QD film temperature of 50° C. The change of optical parameters of the QD film after flux testing for 1'000 hours was measured with the same procedure as for measuring the initial performance (described above). The change of optical parameters were as following:

- Change of y-value: from 0.15 to 0.119 (−0.031)
- Change of LCF: from 50% to 40% (−10%)
- Change of green emission wavelength: from 526 nm to 525 nm (−1 nm)
- Change of green FWHM: 0 nm Similar results are obtained when replacing $FAPbBr_3$ by $[CsFA]PbBr_3$. Such perovskites are described in Document WO2018/028869 A1, e.g. example 10.

Comparative Example 1 for Example 3

Preparation of a green remote perovskite QD film with high haze and low $T_g$.

The procedure was the same as in the previous procedure for the QD film with low haze, except the following parameters were changed:

- Pb amount of the whole UV curable acrylate mixture is 200 ppm
- 12 wt % scattering particles KMP-590 were mixed into the UV curable acrylate mixture to increase the haze of the final QD film.

The as obtained green perovskite QD film showed an emission wavelength of 525 nm, a FWHM of 22 nm ands a y-value of 0.149 (almost identical to the low-haze QD film in experiment 3). The LCF of the QD film is 43%. The haze of the QD film was 98% and the transmittance is 81%. The measured Tg of the UV-cured resin composition was 77° C. It can be seen that the LCF is lower than in experiment 3. A higher haze leads to a lower LCF and a lower haze leads to a higher LCF. Therefore, a lower haze of the QD film is beneficial to have a higher LCF and in turn a higher display efficiency (at specific comparable white point colour coordinates).

The change of optical parameters of the QD film after flux testing for 1'000 hours were as following:

- Change of y-value: from 0.149 to 0.058 (−0.091)
- Change of LCF: from 43% to 14% (−29%)
- Change of green emission wavelength: from 525 nm to 521 nm (−4 nm)
- Change of green FWHM: 0 nm These results show that a higher haze of the QD film leads to lower QD film stability under high blue flux compared to example 3 (specifically, the y-value, LCF and emission wavelength are all less stable). Therefore, it is advantageous to have a low haze of the QD film which leads to improved QD film stability under high blue flux in order to have stable colour coordinates and a stable white point during the operating life-time of the display device.

Comparative Example 2 for Example 3

Preparation of a green remote perovskite QD film with low haze and high $T_g$.

The procedure was the same as in the procedure of example 3, except the acrylate monomer mixture (0.7 g FA-513AS, Hitachi Chemical, Japan/0.3 g Miramer M240, Miwon, Korea) was replaced by the following acrylate monomer mixture:

0.7 g FA-DCPA, Hitachi Chemical, Japan/0.3 g FA-320M, Hitachi Chemical, Japan.

The as obtained green perovskite QD film showed an emission wavelength of 526 nm, a FWHM of 22 nm and a y-value of 0.153 (almost identical to the low-haze QD film in experiment 3). The LCF of the QD film is 49%. The haze of the QD film was 51% and the transmittance is 85%. The measured Tg of the UV-cured resin composition was 144° C.

The change of optical parameters of the QD film after flux testing for 1'000 hours were as following:

Change of y-value: from 0.153 to 0.068 (−0.085)

Change of LCF: from 49% to 21% (−28%)

Change of green emission wavelength: from 526 nm to 525 nm (−1 nm)

Change of green FWHM: 0 nm

These results show that a high $T_g$ of the solid polymer of the QD film (self-supporting film) leads to lower QD film stability under high blue flux. Therefore it is advantageous to have a low $T_g$ of the QD film which leads to improved QD film stability under high blue flux in order to have stable colour coordinates and a stable white point during the operating life-time of the display device.

TABLE 1

Summary of the parameter changes after high-flux testing for experiment 3 and comparative examples 1 and 2:

| Ex. #: haze, Tg | test condition | y-value (—) | PP (nm) | FWHM (nm) | LCF (%) |
|---|---|---|---|---|---|
| Ex. 3, inventive | initial | 0.150 | 526 | 22 | 50 |
| 50% Haze, | 1000 h | 0.119 | 525 | 22 | 40 |
| 75° C. Tg | high flux | | | | |
| | Δ | −0.031 | −1 | −0 | −10 |
| Comparative Ex. 1 | initial | 0.149 | 525 | 22 | 43 |
| 98% Haze, | 1000 h | 0.058 | 521 | 22 | 14 |
| 77° C. Tg | high flux | | | | |
| | Δ | −0.091 | −4 | −0 | −29 |
| Comparative Ex. 2 | initial | 0.153 | 526 | 22 | 49 |
| 51% Haze, | 1000 h | 0.068 | 525 | 22 | 21 |
| 144° C. Tg | high flux | | | | |
| | Δ | −0.085 | −1 | −0 | −28 |

The invention claimed is:

1. A self-supporting film, comprising luminescent crystals embedded in a polymer, wherein the luminescent crystals are of perovskite structure and emit green and/or red light in response to excitation by light of a wavelength shorter than the emitted light, and wherein the self-supporting film has a haze $h_2$ of $20 \leq h_2 \leq 70\%$, wherein the polymer comprises scattering particles, the polymer comprises an acrylate and has a glass transition temperature Tg of 100° C. or less, the scattering particles are selected from the group of organopolysiloxanes and are present in an amount of more than 0.1 wt % and less than 8 wt %.

2. The self-supporting film according to claim 1, wherein the luminescent crystals are embedded in a cross-linked solid polymer.

3. The self-supporting film according to claim 1, wherein the luminescent crystals are selected from compounds of formula (II):

$$[M^1A^1]_aM^2_bX_c \quad \text{(II), wherein:}$$

$A^1$ represents one or more organic cations, $M^1$ represents one or more alkaline metals, $M^2$ represents one or more metals other than $M^1$, X represents one or more anions selected from the group consisting of halides, pseudohalides and sulfides, a represents 1-4, b represents 1-2, c represents 3-9, and wherein either $M^1$, or $A^1$, or $M^1$ and $A^1$ being present.

4. The self-supporting film according to claim 3, wherein $M^2$ represents Pb, and wherein the concentration of Pb is 5-200 mg/m$^2$.

5. The self-supporting film according to claim 1, wherein the acrylate comprises repeating units selected from monofunctional acrylate monomers and multifunctional acrylate monomers.

6. The self-supporting film according to claim 1, wherein the solid polymer is characterized by a molar ratio of the sum of (oxygen+nitrogen) to carbon <0.9.

7. The self-supporting film according to claim 1, wherein the solid polymer is configured as a sheet-like polymer and/or wherein the solid polymer is sandwiched between two barrier layers.

8. A light emitting device, in particular a liquid crystal display (LCD), comprising the self-supporting film according to claim 1.

9. The self-supporting film according to claim 3, wherein $A^1$ is formamidinium, $M^2$ is Pb, and X is Br.

* * * * *